United States Patent
Hsu et al.

(10) Patent No.: US 6,492,662 B2
(45) Date of Patent: Dec. 10, 2002

(54) T-RAM STRUCTURE HAVING DUAL VERTICAL DEVICES AND METHOD FOR FABRICATING THE SAME

(75) Inventors: Louis L. Hsu, Fishkill, NY (US); Rajiv V. Joshi, Yorktown Heights, NY (US)

(73) Assignee: IBM Corporation, Armonk, NY (US)

( * ) Notice: Subject to any disclaimer, the term of this patent is extended or adjusted under 35 U.S.C. 154(b) by 0 days.

(21) Appl. No.: 09/835,732

(22) Filed: Apr. 16, 2001

(65) Prior Publication Data

US 2002/0151130 A1 Oct. 17, 2002

(51) Int. Cl.$^7$ ................................................ H01L 29/72
(52) U.S. Cl. ........................ 257/124; 257/133; 257/296; 257/300
(58) Field of Search .................................. 257/296, 300, 257/124, 133

(56) References Cited

U.S. PATENT DOCUMENTS

2001/0024841 A1 * 9/2001 Noble et al. ................. 257/300

OTHER PUBLICATIONS

*A Novel Thyristor–based SRAM Cell (T–RAM) for High–Speed, Low–Voltage, Giga–scale Memories* by Farid Nemati and James D. Plummer, Sep. 1999 IEEE, pp. 283–286.

*A Novel High Density, Low Voltage SRAM Cell with a Vertical NDR Device* by Farid Nemati and James D. Plummer, Jun. 1998 IEEE, pp. 66 and 67.

* cited by examiner

*Primary Examiner*—Edward Wojciechowicz
(74) *Attorney, Agent, or Firm*—Dilworth & Barrese, LLP

(57) ABSTRACT

A T-RAM array having a plurality of T-RAM cells is presented where each T-RAM cell has dual vertical devices. Each T-RAM cell has a vertical thyristor and a vertical transfer gate. The top surface of each thyristor is coplanar with the top surface of each transfer gate within the T-RAM array to provide a planar cell structure for the T-RAM array. A method is also presented for fabricating the T-RAM array having the vertical thyristors, the vertical transfer gates and the planar cell structure.

14 Claims, 5 Drawing Sheets

T-RAM STRUCTURE HAVING DUAL VERTICAL DEVICES AND METHOD FOR FABRICATING THE SAME

FIELD OF THE INVENTION

This invention relates to the field of integrated circuit (IC) design. Specifically, it relates to a Thyristor Random Access Memory (T-RAM) structure and method for fabricating the same. The T-RAM structure has dual vertical devices and a planar cell structure.

BACKGROUND OF THE INVENTION

A low-power, high-speed and high-density negative differential resistance (NDR) based (NDR-based) SRAM cell which can provide DRAM-like densities at SRAM-like speeds has been proposed by Farid Nemati and James D. Plummer in "A Novel High Density, Low Voltage SRAM Cell with a Vertical NDR Device," 1998 Symposium on VLSI Technology Digest of Technical Papers, IEEE, pages 66–67, 1998.

The memory device structure is shown by FIG. 1 and is designated by reference numeral 10; the memory device structure is called a Thyristor-based Random Access Pi Memory (T-RAM) cell. The T-RAM device or memory cell 10 consists of a thin vertical pnpn thyristor 12 with a surrounding nMOS gate 14 as the bistable element and a planar nMOSFET as the access transistor 16. The circuit schematic of the T-RAM cell 10 is shown by FIG. 2.

To access the T-RAM cell 10, two wordlines are necessary. The first wordline WL1 is used to control an access gate of the transfer nMOSFET device 16, while the second wordline WL2 is the surrounding nMOS gate 14 which is used to control the switch of the vertical pnpn thyristor 12. The thyristor 12 is connected to a reference voltage Vref. The second wordline WL2 improves the switching speed of the thyristor 12 from 40 ns to 4 ns with a switching voltage. A bitline BL connects the T-RAM cell 10 to a sense amplifier for reading and writing data from and to the T-RAM cell 10. The T-RAM cell 10 exhibits a very low standby current in the range of 10pA.

When writing a "high", the bitline BL is set at low, and both wordlines WL1, WL2 are switched on. At this moment, the thyristor 12 behaves like a forward biased pn diode. After a write operation, both gates are shut off, and a "high" state is stored in the thyristor 12. In a read operation, only the first wordline WL1 is activated, a large "on" current will read on the bitline BL through the access gate. When writing a "low", the bitline BL is set at "high" state, and both wordlines WL1, WL2 are switched on. At this moment, the thyristor 12 behaves like a reverse biased diode. After the write operation, both gates are shut off, and a "low" state is stored in the thyristor 12. Similarly, in a consequence read, a very low current will be detected on the bitline BL. Further details of the operation of the T-RAM cell 10 and its gate-assisted switching are described in Nemati et al.; the contents of which are incorporated herein by reference.

A T-RAM array having a plurality of T-RAM cells 10 has demonstrated a density equivalent to that of DRAM arrays and a speed equivalent to that of SRAM arrays. Hence, the T-RAM array provides advantages afforded by both SRAM and DRAM arrays. These advantages make T-RAM an attractive choice for future generations of high speed, low-voltage, and high-density memories and ASICs.

However, there are several drawbacks of the T-RAM cell 10. First, there is the requirement of forming the thyristor 12 having a vertical pillar on a substrate during a fabrication process. Difficulties arise in controlling the dimensions of the vertical pillar and reproducing these dimensions for each T-RAM cell 10 in the T-RAM array. Second, due to the existence of a vertical thyristor 12 in each T-RAM cell 10, each T-RAM cell 10 is not planar and therefore difficult to scale. Third, it is difficult to control the dimension while forming the surrounding gate around the base of each vertical thyristor 12. Fourth, each T-RAM cell is fabricated prior to or after fabricating any other devices, such as P-MOS and n-MOS support devices (i.e., sense amplifiers, wordline drivers, column and row decoders, etc.), which results in extra fabrication steps, thereby increasing thermal budget and manufacturing cost. Finally, due to these drawbacks, the resulting T-RAM cell 10 cannot be smaller than $8F^2$ and the cost of fabricating a T-RAM array is high.

SUMMARY

An aspect of the present invention is to provide a T-RAM array having a planar cell structure for overcoming the disadvantages of the prior art.

Another aspect of the present invention is to provide a T-RAM array having a plurality of T-RAM cells, wherein each of the plurality of T-RAM cells has a planar cell structure and dual vertical devices, i.e., a vertical thyristor and a vertical transfer gate.

Also, another aspect of the present invention is to provide a memory system having a plurality of T-RAM cells arranged in an array, wherein each of the plurality of T-RAM cells has a planar cell structure and dual vertical devices, i.e., a vertical thyristor and a vertical transfer gate.

Further, another aspect of the present invention is to provide a method for fabricating a high-density, high-yield and low-cost T-RAM array having a plurality of T-RAM cells and a planar cell structure on a SOI substrate. Each of the plurality of T-RAM cells has a planar cell structure and dual vertical devices, i.e., a vertical thyristor and a vertical transfer gate.

Finally, another aspect of the present invention is to provide a method for fabricating a T-RAM array which improves performance and yield, and reduces cost and thermal budget.

Accordingly, in an embodiment of the present invention, a T-RAM array is presented having a planar cell structure and a plurality of T-RAM cells where each T-RAM cell has dual vertical devices. That is, each T-RAM cell has a vertical thyristor and a vertical transfer gate. A top surface of each thyristor is coplanar with a top surface of each transfer gate within the T-RAM array to provider the planar cell structure for the T-RAM array. The inventive structure of each T-RAM cell results in higher performance at low voltage, e.g., Vdd=1V.

In another embodiment of the present invention, a memory system is presented having a plurality of T-RAM cells arranged in an array. Each of the T-RAM cells in the array has a planar cell structure and dual vertical devices, i.e., a vertical thyristor and a vertical transfer gate.

Further still, in another embodiment of the present invention, a method is presented for fabricating a T-RAM array having a planar cell structure. Each of the T-RAM cells in the T-RAM array has dual vertical devices, i.e., a vertical thyristor and a vertical transfer gate. The method entails forming the vertical devices in trenches of the same base, such that alignment of the transfer gate to a channel region in each T-RAM cell is highly reproducible. Preferably, the T-RAM array is built on a semiconductor silicon-oninsulator (SOI) wafer to reduce junction capacitance and improve scalability.

DETAILED DESCRIPTION OF THE INVENTION

The present invention provides a T-RAM array having a planar cell structure and a plurality of T-RAM cells. Each of the T-RAM cells of the inventive T-RAM array includes dual vertical devices, i.e., a vertical thyristor and a vertical transfer gate. A top surface of the vertical thyristor is coplanar with a top surface of the vertical transfer gate to provide the planar cell structure for the T-RAM array. Hence, the T-RAM array of the present invention provides for less control during manufacturing, and is planar and more scalable than prior art T-RAM arrays. The present invention also provides a preferred method for fabricating the T-RAM array to reduce cost and thermal budget, while increasing performance, density and yield.

Figure 3:
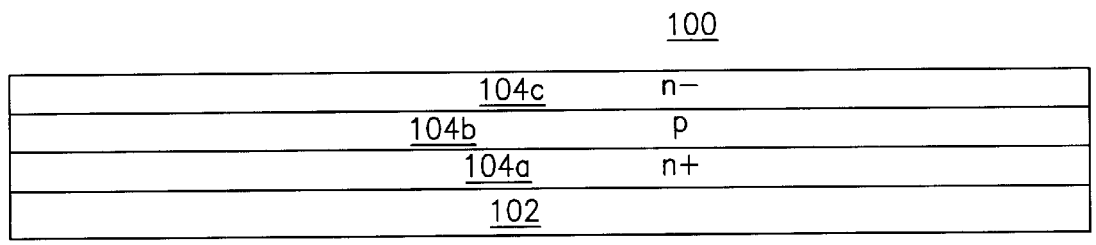
FIG. 3 is a cross-sectional view of a portion of a semiconductor silicon-on-insulator (SOI) wafer having a buried oxide layer and a series of layers for fabricating T-RAM cells according to the present invention.

FIG. 3 is a cross-sectional view of a portion of a semiconductor silicon-on-insulator (SOI) wafer having a buried oxide layer and a series of layers for fabricating T-RAM cells according to the present invention. The wafer is designated by reference numeral 100. It is contemplated that other types of semiconductor wafers besides semiconductor SOI wafers, such as semiconductor bulk wafers, can be used for fabricating T-RAM cells according to the present invention.

With reference to FIG. 3, a semiconductor SOI wafer 100 having a buried oxide layer 102 and a series of layers 104$a$–$c$ is used as the substrate to form the T-RAM cells. The SOI wafer 100 has an n$^+$ layer 104$a$ on top of the buried oxide layer 102. A thin p layer 104$b$ is epitaxially grown, then a thin n$^-$ layer 104$c$ is subsequently grown.

The n$^+$ layer 104$a$ is preferably formed by implanting an n$^+$ type arsenic implant at an energy in the range of 2 to 15 KeV and a dosage of between 8E14 cm$^{-2}$ to 3E15/cm$^2$. The p layer 104$b$ is formed by epitaxial growth with a p-type material. Preferably, the p layer 104$b$ is formed by epitaxial growth with p-type boron at a dosage of between 4E13/cm$^2$ to 1E14/cm$^2$. The n– layer 104$c$ is also formed by epitaxial growth with an n– type material. Preferably, the n– layer 104$c$ is formed by epitaxial growth with n– type arsenic at a dosage of between 2E13/cm$^2$ to 8E13/cm$^2$.

A description of the preferred method for fabricating a T-RAM cell of the T-RAM array will now be provided. The same fabrication method is used for simultaneously fabricating all of the T-RAM cells of the T-RAM array. With reference to FIGS. 4—14 there are shown cross-sectional views of the semiconductor wafer 100 for fabricating the T-RAM cell.

Figure 4:
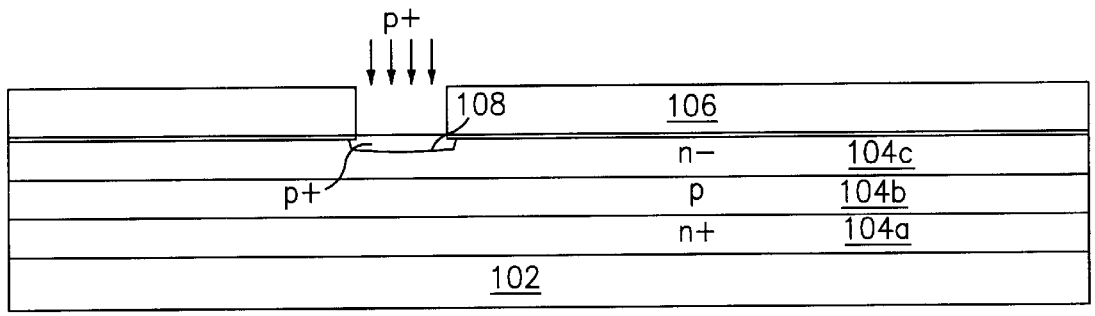
FIGS. 4—14 are cross-sectional views illustrating a preferred process for fabricating a T-RAM cell according to the present invention.

With reference to FIG. 4, a first mask 106 is used to implant the top layer 104$c$ with a p$^+$ dopant to form a p$^{30}$ dopant region 108. The p$^{30}$ dopant region 108 is preferably formed by implanting a p-type boron implant at an energy in the range of 0.5 to 2 KeV and a dosage of between 2E14/cm$^2$ to 8E14/cm$^2$. The p$^{30}$ dopant region 108 would serve as the anode of the PNPN thyristor. After this implantation step, the remaining n– layer 104$c$ is used as the base of the thyristor.

Figure 5:
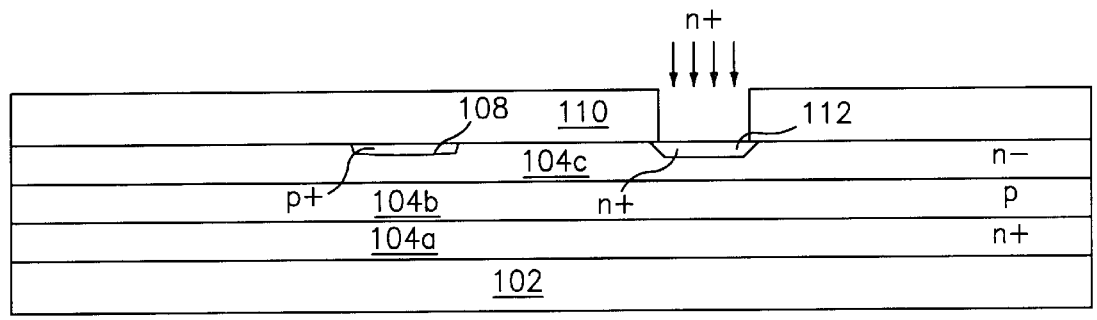

With reference to FIG. 5, a second mask 110 is used to implant the same layer 104$c$ with an n$^+$ dopant to form an n$^+$ dopant region 112. The n$^+$ dopant region 112 is preferably formed by implanting an n-type arsenic implant at an energy in the range of 2 to 15 KeV and a dosage of between 8E14/cm$^2$ to 3E15/cm$^2$. The n$^+$ dopant region 112 would serve as the source contact for the transfer gate. The implant energy for implanting the n$^+$ dopant should be sufficient, such that the junction depth of the n$^+$ dopant region 112 occupies most of the thickness of the n– layer 104$c$.

Figure 6:
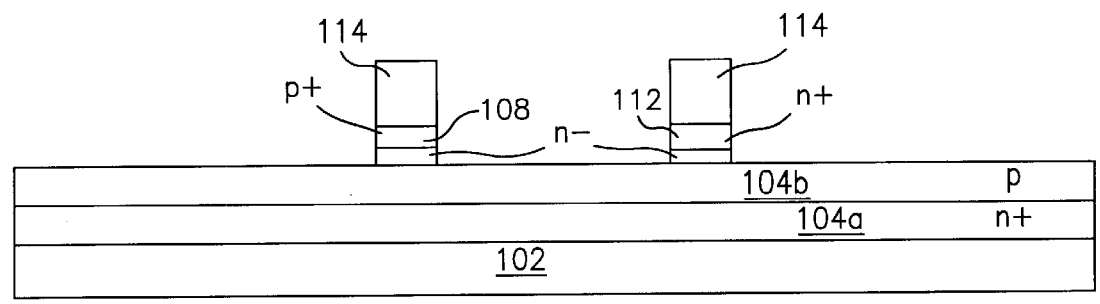

With reference to FIG. 6, a third mask 114 is used to pattern the contact regions of the two devices, i.e., the vertical thyristor and the vertical transfer gate, into square-like regions. A reactive ion etch process is carried out to remove the n–layer 104$c$ and stop at the p layer 104$b$ using a conventional silicon etch process with a proper end point technique.

Figure 7:
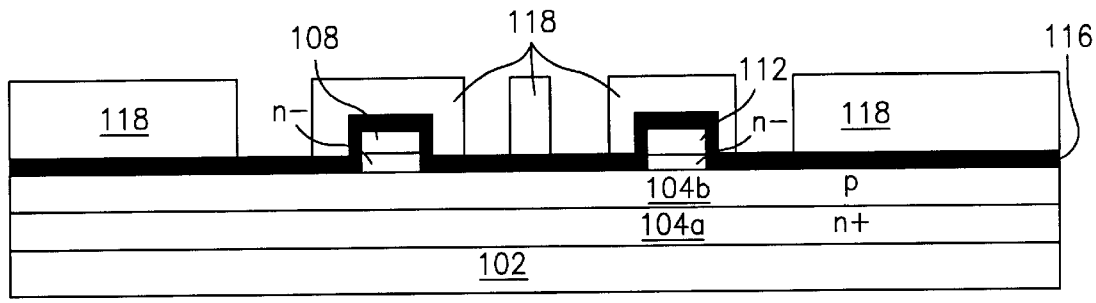

With reference to FIG. 7, a layer of dielectric 116, e.g., CVD nitride, is deposited on the structure. The thickness is thick enough to avoid any gate overlap capacitance so that the device's performance is not compromised.

Figure 8:
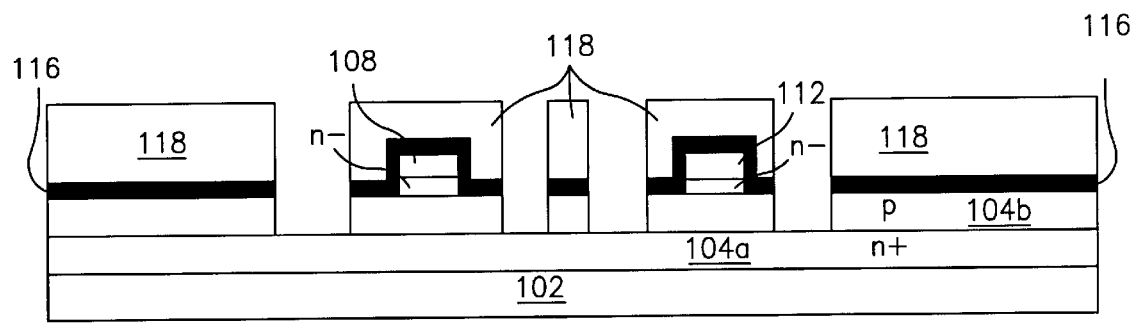

With reference to FIG. 8, a fourth mask 118 is then used to define the dual surrounded gate areas. An etch process is then performed to remove portions of the dielectric layer 116 and portions of the p layer 104$b$.

Figure 9:
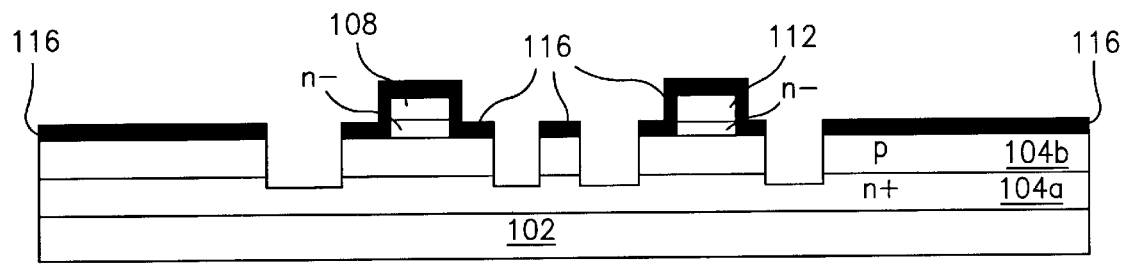

With reference to FIG. 9, a timed-over etch as known in the art is performed into the n$^+$ layer 104$a$ to ensure channel overlapping, in order for the device's performance to be uniform.

Figure 10:
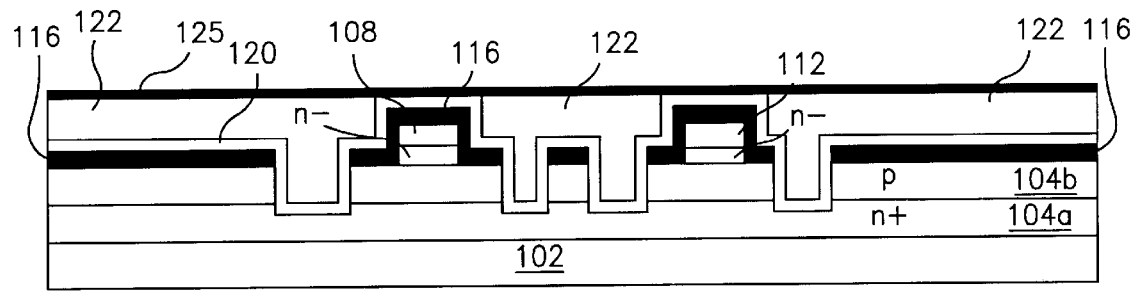

With reference to FIG. 10, a gate dielectric layer 120, e.g., thermal oxide and/or CVD oxide, is then formed. In-situ n$^+$ doped CVD polysilicon 122 is then deposited on top of the gate dielectric layer 120. A planarization process may then be carried out by CMP. A thin nitride layer 125 is then deposited over the structure.

Figure 11:
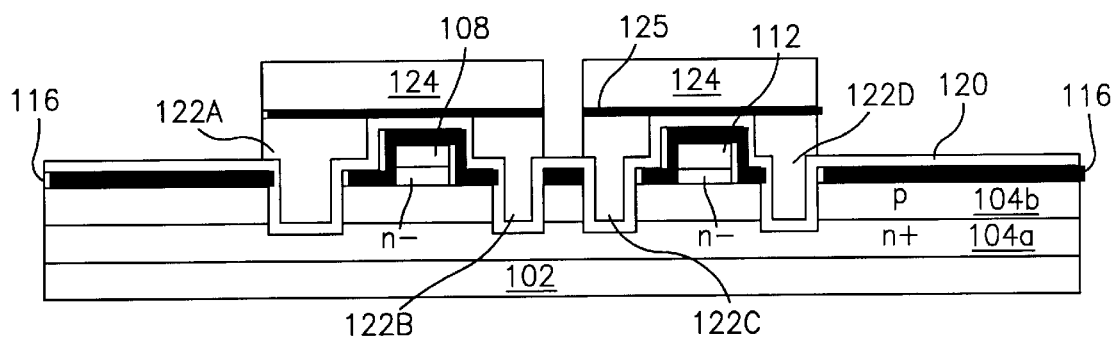

With reference to FIG. 11, a fifth mask 124 is then used to define an interconnect between the transfer gate and the thyristor by etching the polysilicon 122. The etching process defines the polysilicon 122 into first areas 122A, 122B and second areas 122C, 122D. The first areas 122A, 122B are the portions of the surrounding gate for the thyristor and the second areas 122C, 122D are the portions of the surrounding gate for the transfer gate.

Figure 12:
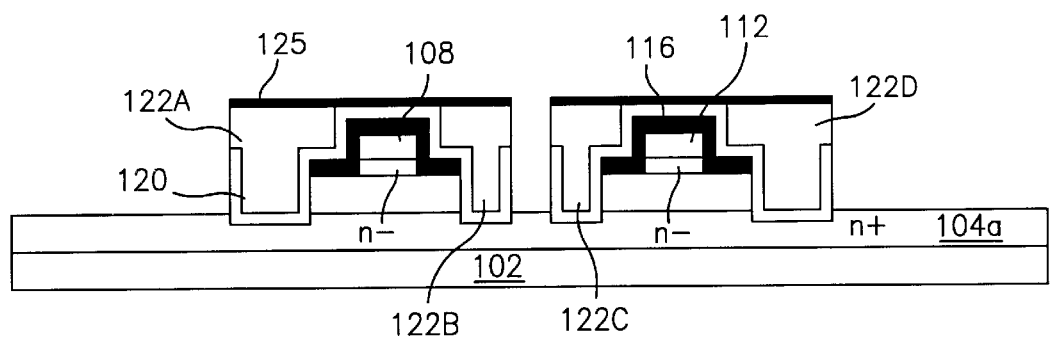

With reference to FIG. 12, the etching process continues, in order to etch the gate dielectric layer 120 and dielectric layer 116 in the areas surrounding the transfer gate and the thyristor, as well as the p layer 104$b$.

Figure 13:
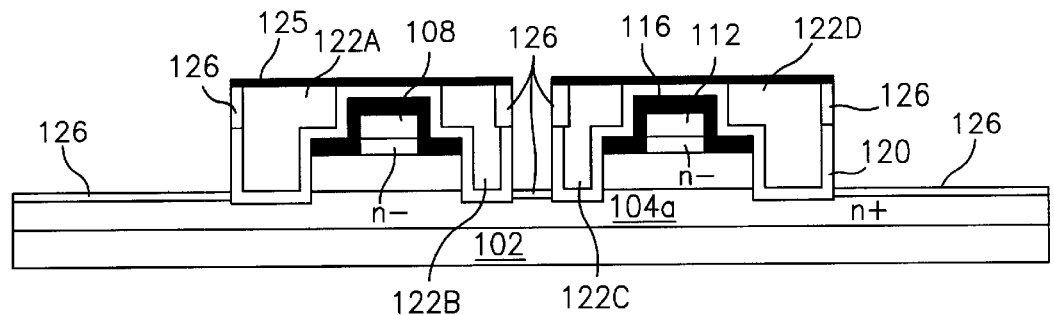

With reference to FIG. 13, the exposed polysilicon surfaces and the n$^+$ layer 104$a$ are oxidized to form oxidized surfaces 126.

Figure 14:
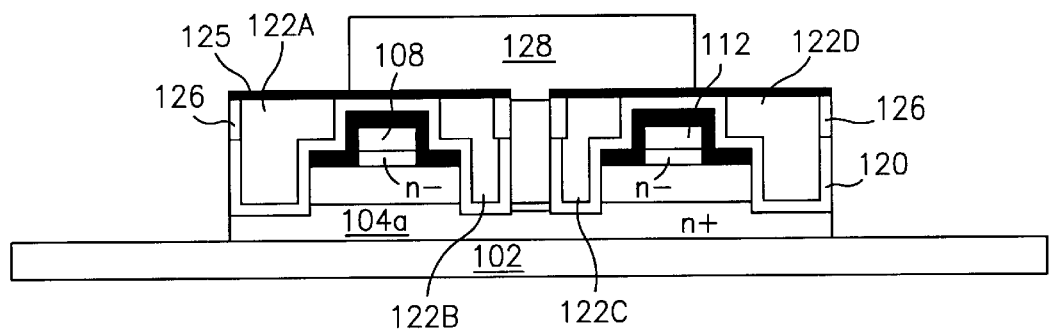

With reference to FIG. 14, a black-out mask 128 is used to protect the n$^+$ link between the two devices. A reactive ion etch is then carried out to remove the exposed n$^+$ layer 104$a$, in order for the T-RAM cells to be isolated from each other. The gate areas of the two devices are protected by the polysilicon 122.

Figure 15:
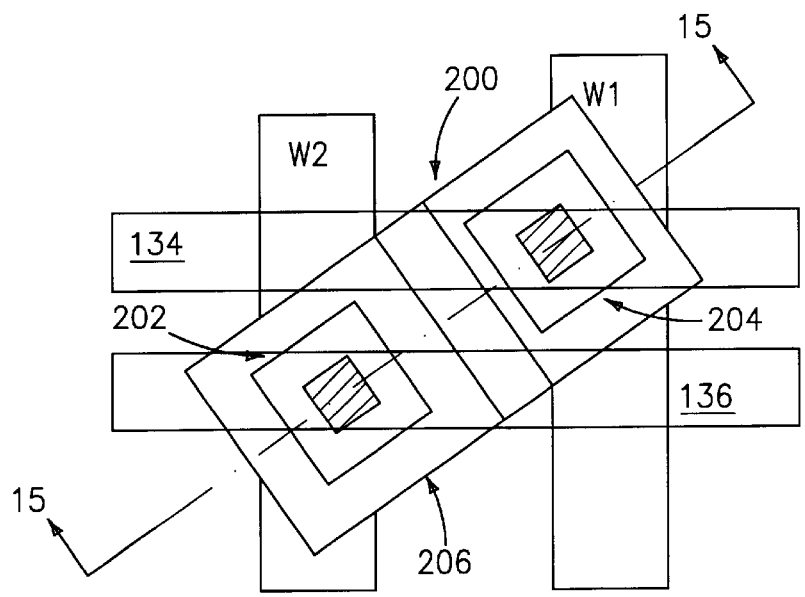
FIG. 15 is a top view of a portion of a T-RAM array showing the T-RAM cell fabricated according to the present invention.
Figure 16:
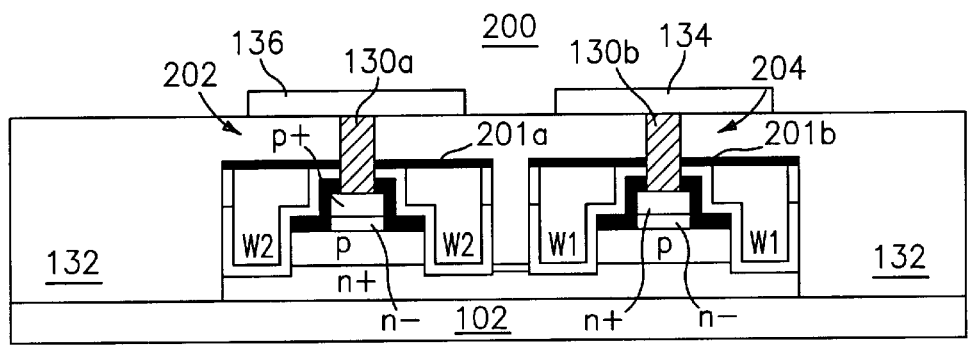
FIG. 16 is a cross-sectional view of a T-RAM cell taken along line 15—15 in FIG. 15.

With reference to FIG. 16 there is shown a cross-sectional view taken along line 15—15 in FIG. 15 of the T-RAM cell 200 fabricated according to the present invention. A top surface 201$a$ of device 202, i.e., the vertical thyristor, is coplanar with a top surface 201b of device 204, i.e., the vertical transfer gate. In other words, both devices 202, 204 have approximately the same height to provide an overall planar structure for the T-RAM cell 200 and T-RAM array. Contacts 130a, 130b to the devices 202, 204, i.e., the vertical thyristor 202 and the vertical transfer gate 204, are provided. The contacts 130a, 130b have approximately the same height to maintain the overall planar structure for the T-RAM cell 200.

A conventional insulating material 132 is deposited over the structure and planarized. The insulating material 132 encapsulates the devices 202, 204 and provides a planar structure for the T-RAM cell 200 and the overall T-RAM array. Metal wiring is then provided to form bitlines 134 and reference voltage lines 136. A first wordline traversing the T-RAM cell 200 is identified by W1 and a second wordline traversing the T-RAM cell 200 is identified by W2.

FIG. 15 is a top view of a portion of a T-RAM array showing the T-RAM cell 200 fabricated according to the present invention. FIG. 15 also shows the location of the first and second wordlines W1, W2, the bitline 134 and reference voltage line 136. The dual ring devices are formed in an $n^+$ silicon island 206. The island 206 is tilted at 45 degrees while the two wordlines W1, W2 are in the vertical direction and the bitline 134 and reference voltage line 136 are in the horizontal direction.

Figure 17:
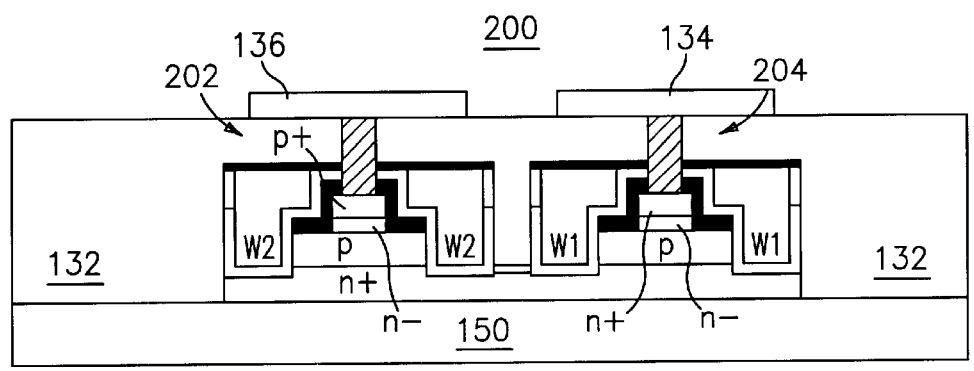
FIG. 17 is a cross sectional view of a T-RAM cell where a portion of the T-RAM cell resides within a p-well.

It is noted that if the devices 202, 204 are built on a bulk silicon wafer, the $n^+$ layer 104a must reside within a p-well 150 for isolation as shown by FIG. 17.

The planar T-RAM cell 200 structure includes a first vertical surrounded trench gate which forms the vertical thyristor 202, and a second vertical surrounded trench gate which forms the vertical transfer gate 204. The structure of the T-RAM cell 200 allows the fabrication steps to be performed with wide process windows, such as the alignment step of aligning the gate to the channel of the devices, and the overlap step of overlapping the gate to the source and the drain, are done predominantly in a self-aligned manner. Further, by both vertical devices sharing the same n-p-n substrate on a SOI or bulk substrate, manufacturing cost is reduced while providing better device quality and reliability.

Figure 1:
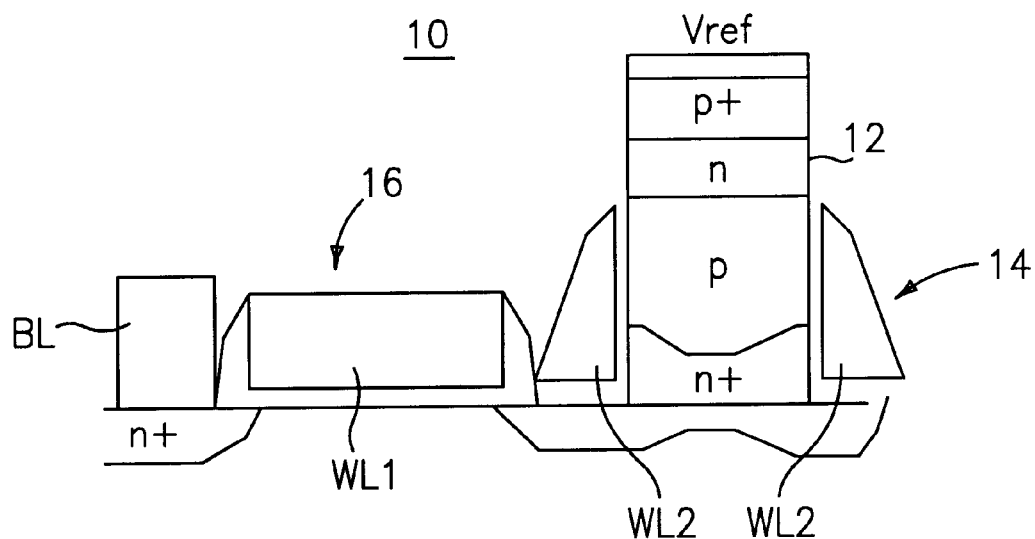
FIG. 1 illustrates the device structure of a prior art T-RAM cell.
Figure 2:
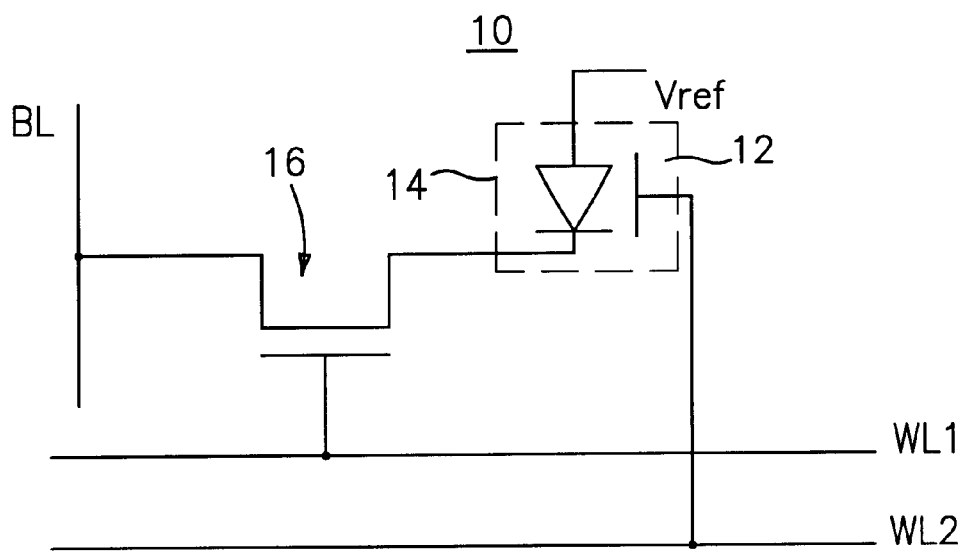
FIG. 2 is a circuit diagram of the prior art T-RAM cell.

With the method of the present invention, minimal process steps and mask levels are required to fabricate planar T-RAM cells 200 of a T-RAM array on bulk or SOI which results in a significant saving in manufacturing cost and provides a better thermal budget over prior art methods. The thyristor and transfer gate of each T-RAM cell 200 are simultaneously fabricated to reduce manufacturing cost and time, while providing reliable T-RAM cells 200. Additionally, the planar T-RAM array structure is easy to fabricate, since the depth of focus for the lithographic tools and metal interconnects is easier to handle than the three-dimensional vertical device of the prior art T-RAM structure (see FIG. 1).

By sharing etching and diffusion steps, thermal budget is tightly controlled. This leads to better device quality and reliability. Otherwise, extra thermal steps needed to form T-RAM cells will cause the junction depth of the normal device deeper which leads to higher junction capacitance and poorer performance. Additionally, the T-RAM cells having the dual surrounded gate structure which is fabricated according to the inventive method are suitable for future scaling than the prior art T-RAM cells which have the vertical thyristor. Further, the structure of the present invention results in higher performance at low voltage (e.g., Vdd=1V).

Further, the method of the present invention provides twin-tower T-RAM cells having a size of less than or equal to $6F^2$. Accordingly, the density of a T-RAM array is small, while the yield and memory performance is high.

A T-RAM array having a plurality of T-RAM cells 200 according to the present invention can be provided within a central processing unit or other type of processor to provide a reliable and high performance memory system.

What has been described herein is merely illustrative of the application of the principles of the present invention. Other arrangements and methods, such as using different substrates, may be implemented by those skilled in the art without departing from the scope and spirit of this invention.

We claim:

1. A memory system comprising a plurality of T-RAM cells arranged in an array, each of the plurality of T-RAM cells including two vertical devices having approximately the same height, wherein a first vertical device of each of the plurality of T-RAM cells is a thyristor and a second vertical device of each of the plurality of T-RAM cells is an access transistor.

2. The memory system according to claim 1, wherein each of the plurality of T-RAM cells has a size of less than or equal to $6F^2$.

3. The memory system according to claim 1, wherein the plurality of T-RAM cells are fabricated on a semiconductor SOI or bulk wafer.

4. The memory system according to claim 1, wherein a common p-well forms a portion of the thyristor and access transistor of a T-RAM cell of the plurality of T-RAM cells.

5. The memory system according to claim 1, wherein the two vertical devices each include an $n^+$ region, wherein the $n^+$ regions of the two vertical devices are interconnected.

6. The memory system according to claim 1, wherein each of the plurality of T-RAM cells has a planar cell structure.

7. A T-RAM array comprising:
a plurality of T-RAM cells, each of the plurality of T-RAM cells including two vertical devices having approximately the same height, wherein a first vertical device of each of the plurality of T-RAM cells is a thyristor and a second vertical device of each of the plurality of T-RAM cells is an access transistor.

8. The array according to claim 7, wherein each of the plurality of T-RAM cells has a size of less than or equal to $6F^2$.

9. The array according to claim 7, wherein the plurality of T-RAM cells are fabricated on a semiconductor SOI or bulk wafer.

10. The array according to claim 7, wherein a common p-well forms a portion of the thyristor and access transistor of a T-RAM cell of the plurality of T-RAM cells.

11. The array according to claim 7, wherein each of the plurality of T-RAM cells has a planar cell structure.

12. A T-RAM cell of a memory system comprising:
a thyristor; and
means for providing access to the thyristor;
wherein the thyristor and means for providing access to the thyristor are vertically oriented and have approximately the same height.

13. The memory system according to claim 1, wherein the thyristor is formed on one of the source and drain of the access transistor.

14. The array according to claim 7, wherein the thyristor is formed on one of the source and drain of the access transistor.

* * * * *